United States Patent
Karakas et al.

(10) Patent No.: US 10,699,911 B2
(45) Date of Patent: Jun. 30, 2020

(54) METHOD OF CONFORMAL ETCHING SELECTIVE TO OTHER MATERIALS

(71) Applicant: Tokyo Electron Limited, Minato-ku, Tokyo (JP)

(72) Inventors: Erdinc Karakas, Portland, OR (US); Sonam D. Sherpa, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/178,144

(22) Filed: Nov. 1, 2018

(65) Prior Publication Data
US 2019/0139779 A1 May 9, 2019

Related U.S. Application Data

(60) Provisional application No. 62/582,733, filed on Nov. 7, 2017, provisional application No. 62/627,561, filed on Feb. 7, 2018.

(51) Int. Cl.
*H01L 21/311* (2006.01)
*H01L 29/66* (2006.01)

(52) U.S. Cl.
CPC .... *H01L 21/31116* (2013.01); *H01L 29/6653* (2013.01); *H01L 29/66795* (2013.01)

(58) Field of Classification Search
CPC ....... H01L 21/31116; H01L 21/823468; H01L 29/6653; H01L 29/66795
USPC .................................. 438/724, 743, 744
See application file for complete search history.

(56) References Cited

U.S. PATENT DOCUMENTS

| | | | |
|---|---|---|---|
| 5,431,772 A | 7/1995 | Babie et al. | |
| 7,671,421 B2* | 3/2010 | Chen ................ | H01L 21/28079 257/351 |
| 8,187,486 B1 | 5/2012 | Liu et al. | |
| 8,501,630 B2 | 8/2013 | Metz et al. | |
| 8,956,980 B1 | 2/2015 | Chen et al. | |
| 2003/0207585 A1* | 11/2003 | Choi ................ | H01L 21/31116 438/723 |
| 2015/0249017 A1* | 9/2015 | Raley .................. | H01L 21/0223 438/696 |
| 2018/0269070 A1* | 9/2018 | Eason ............... | H01J 37/32522 |

* cited by examiner

*Primary Examiner* — Binh X Tran
(74) *Attorney, Agent, or Firm* — Wood Herron & Evans LLP

(57) ABSTRACT

Plasma processing methods that provide for conformal etching of silicon nitride while also providing selectivity to another layer are described. In one embodiment, an etch is provided that utilizes gases which include fluorine, nitrogen, and oxygen, for example a gas mixture of $SF_6$, $N_2$ and $O_2$ gases. Specifically, a plasma etch utilizing $SF_6$, $N_2$ and $O_2$ gases at high pressure with no bias is provided. The process accelerates silicon nitride etching by chemical reactions of $[NO]_x$ molecules from the plasma and [N] atoms from silicon nitride film. The etch provides a conformal (isotropic) etch that is selective to other materials such as silicon and silicon oxides (for example, but not limited to, silicon dioxide).

12 Claims, 9 Drawing Sheets

METHOD OF CONFORMAL ETCHING SELECTIVE TO OTHER MATERIALS

RELATED APPLICATIONS

This application claims priority to Provisional Patent Application No. 62/582,733, filed Nov. 7, 2017 entitled "Method of Conformal Etching Selective To Other Materials" and Provisional Patent Application No. 62/627,561, filed Feb. 7, 2018 entitled "Method of Conformal Etching Selective To Other Materials"; the disclosures of which are expressly incorporated herein, in their entirety, by reference.

BACKGROUND

The present disclosure relates to the processing of substrates in plasma process equipment. In particular, it provides a method to achieve conformal selective etching.

The use of plasma systems for the processing of substrates has long been known. For example, plasma etch processing of semiconductor wafers is well known. Historically, plasma etching systems have been utilized to provide selective anisotropic etching techniques. A number of new complex substrate integration schemes have been developed. Some of these schemes require etch processes that are both selective to layers not being etched and that provide conformal (or isotropic) etch characteristics. More particularly, some of these schemes require conformal etching of silicon nitride while providing selectivity to exposed silicon or silicon oxide layers. Specifically, silicon nitride etch plays a key role in a number of these schemes, including hard mask processes and spacer applications. For example, a variety of critical process flows may require trimming silicon nitride hard masks, trimming silicon nitride spacers, removing silicon nitride spaces, revealing structures underneath silicon nitride spacers, fin reveal, inner spacer etching, etc. However, most plasma chemistries that are capable of etching silicon nitride also etch common materials often exposed in such processes, such as, for example, silicon or silicon oxide layers and most plasma chemistries provide for anisotropic etching as opposed to conformal (isotropic) etching.

It would be desirable to provide a plasma process that provides conformal etching of silicon nitride while providing selective etching of the silicon nitride to other layers, such as for example, silicon or silicon oxide layers.

SUMMARY

Described herein are innovative plasma processing methods that provide for conformal etching of silicon nitride while also providing selectivity to another layer. In one embodiment, an etch is provided that utilizes gases which include fluorine, nitrogen, and oxygen, for example a gas mixture of $SF_6$, $N_2$ and $O_2$ gases. Specifically, a plasma etch utilizing $SF_6$, $N_2$ and $O_2$ gases at high pressure with no bias is provided. The process accelerates silicon nitride etching by chemical reactions of $[NO]_x$ molecules from the plasma and [N] atoms from silicon nitride film. The etch provides a conformal (isotropic) etch that is selective to other materials such as silicon and silicon oxides (for example, but not limited to, silicon dioxide).

In one embodiment a method of conformal selective silicon nitride etching is provided. The method comprises providing a workpiece comprising a first portion containing silicon nitride and a second portion containing silicon and/or silicon oxide. The method further includes performing a conformal selective etching process with a non-polymerizing microwave plasma generated using a gas mixture of fluorine-containing gas, nitrogen-containing gas, and oxygen-containing gas at an elevated pressure and zero bias power, the gas mixture at a target ratio of each gas to the gas mixture. The method further comprises controlling operating variables in order to maintain a target etch selectivity of the first portion of the workpiece compared to the second portion of the workpiece.

In another embodiment, a method of processing a substrate is provided. The method comprises providing a silicon nitride layer and providing a second layer, wherein the second layer is comprised of material different than the silicon nitride layer. The method further comprises subjecting the silicon nitride layer and the second layer to a microwave plasma etch process which includes the use of fluorine-containing gas, nitrogen-containing gas, and oxygen-containing gas. The method also comprises controlling the pressure and microwave power of the plasma etch process to provide for a conformal etch of the silicon nitride layer that is selective to the second layer, wherein the pressure of the plasma etch process is greater than or equal to 250 milliTorr.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

For certain advanced process integration flows, it has been found that improved results may be achieved utilizing the plasma processing techniques described herein. Specifically, described herein are innovative plasma processing methods that provide for conformal etching of silicon nitride while also providing selectivity to another layer. In one embodiment, an etch is provided that utilizes gases which include fluorine, nitrogen, and oxygen, for example a gas mixture of $SF_6$ (sulfur hexafluoride), $N_2$ and $O_2$ gases. For example, a plasma etch utilizing $SF_6$, $N_2$ and $O_2$ gases at high pressure with no bias is provided. This process accelerates silicon nitride etching by chemical reactions of $[NO]_x$ molecules from the plasma and [N] atoms from silicon nitride film. The etch provides a conformal (isotropic) etch that is selective to other materials such as silicon and silicon oxides (for example, but not limited to, silicon dioxide).

Figure 1A:
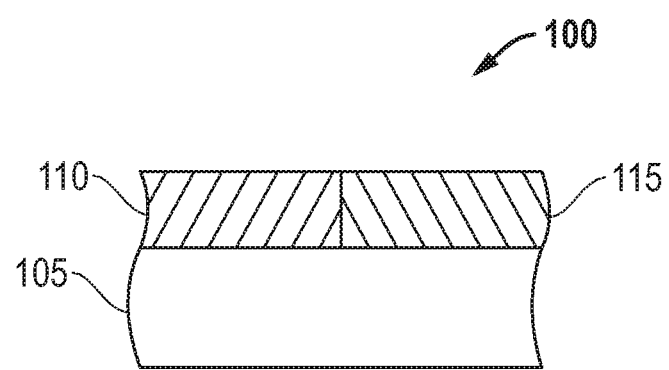
FIGS. 1A and 1B illustrate selective silicon nitride etching.
Figure 1B:
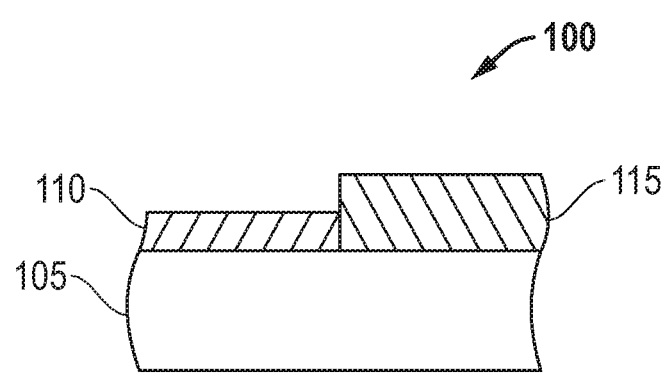

For example, the plasma process may be utilized in process flows in which both silicon nitride ($Si_3N_4$) and silicon (Si) or silicon oxide ($SiO_2$) layers are exposed to the plasma process. In such a process, the various layers may be unmasked to a masking pattern such that both layers are exposed to the plasma process. For example, as shown in FIG. 1A, a substrate 100 may include an exposed $Si_3N_4$ layer 110 and an exposed Si or $SiO_2$ layer 115. An underlying layer(s) 105 is also provided. The substrate 100 may then be exposed to a plasma etch utilizing $SF_6$, $N_2$ and $O_2$ gases at a high pressure and no bias. The plasma process will etch the $Si_3N_4$ layer 110 selective to the Si or $SiO_2$ layer 115, resulting in a structure such as shown in FIG. 1B. An exemplary mechanism of the reaction chemistry is shown below:

$$2NO_{(g)} + 2N_{(s)} \rightarrow 2N_{2(g)} + O_{2(g)}$$

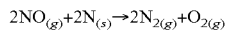

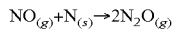

g: gas phase
s: solid phase

Such an etch will provide conformal etching of silicon nitride while still achieving selectivity to silicon or silicon oxide layers. Further, such an etch may provide a non-polymerizing plasma.

As mentioned, the $SF_6$, $N_2$ and $O_2$ may provide selectivity to a various films. Shown below in Table 1 is one exemplary set of etch variable conditions, though it will be recognized that other conditions may be utilized. For example, Table 1 provides exemplary conditions for pressure, microwave power, radio frequency bias power, sulfur hexafluoride ($SF_6$) flow, nitrogen ($N_2$) flow, oxygen ($O_2$) flow, argon (Ar) flow, radical distribution control (RDC), chiller temperature, electrostatic chuck (ESC) center/edge (C/E) temperature.

Figure 4A:
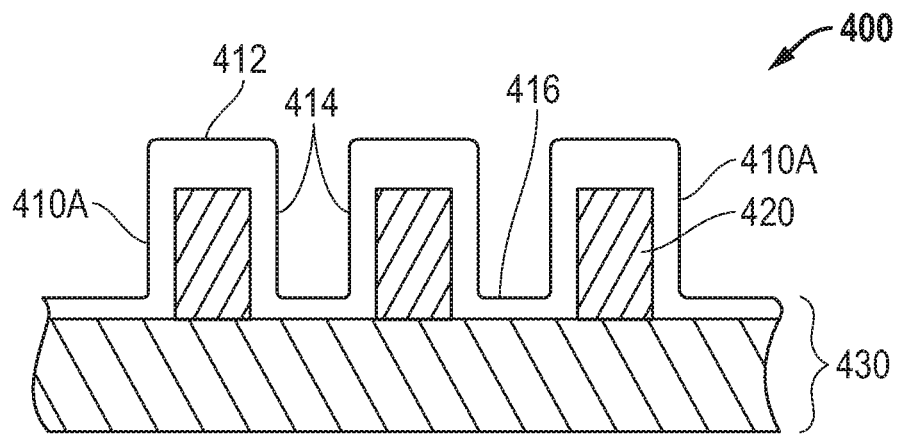
FIGS. 4A and 4B show exemplary structures before etch and after use of an etch according to the techniques disclosed herein.
Figure 4B:
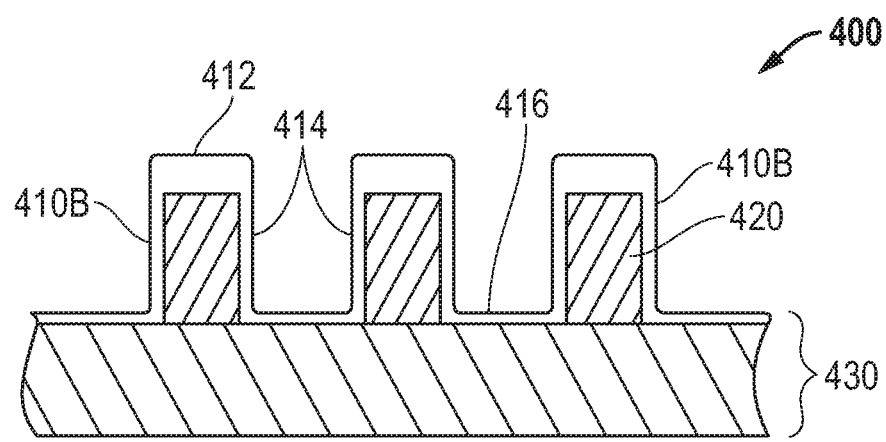

Further, such conditions may provide for a conformal (isotropic) etch. Thus for example, as shown in FIG. 4A, pre-etch a substrate 400 may include a $Si_3N_4$ layer 410A (pre-etch) provided over underlying structures 420 and underlying layers 430. FIG. 4B illustrates the resulting $Si_3N_4$ layer 410B post-etch after being subjected to a conformal (isotropic) $Si_3N_4$ etch such as that described above. As shown in the figures, the amount of the silicon nitride layer that was removed from the flat surfaces and the sidewall surfaces may be substantially similar.

Figure 5A:
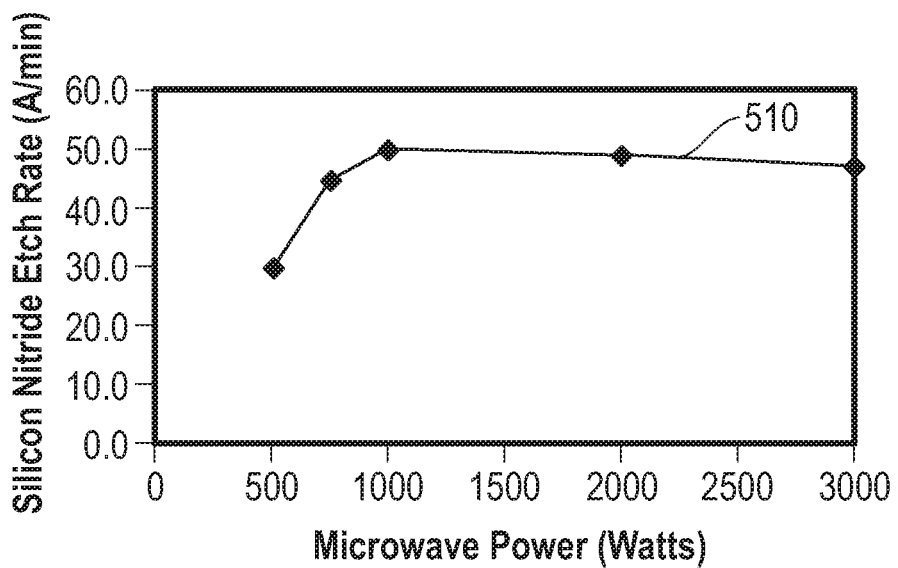
FIG. 5A provides exemplary etch rate versus microwave power data for an etch according to the techniques disclosed herein.
Figure 5B:
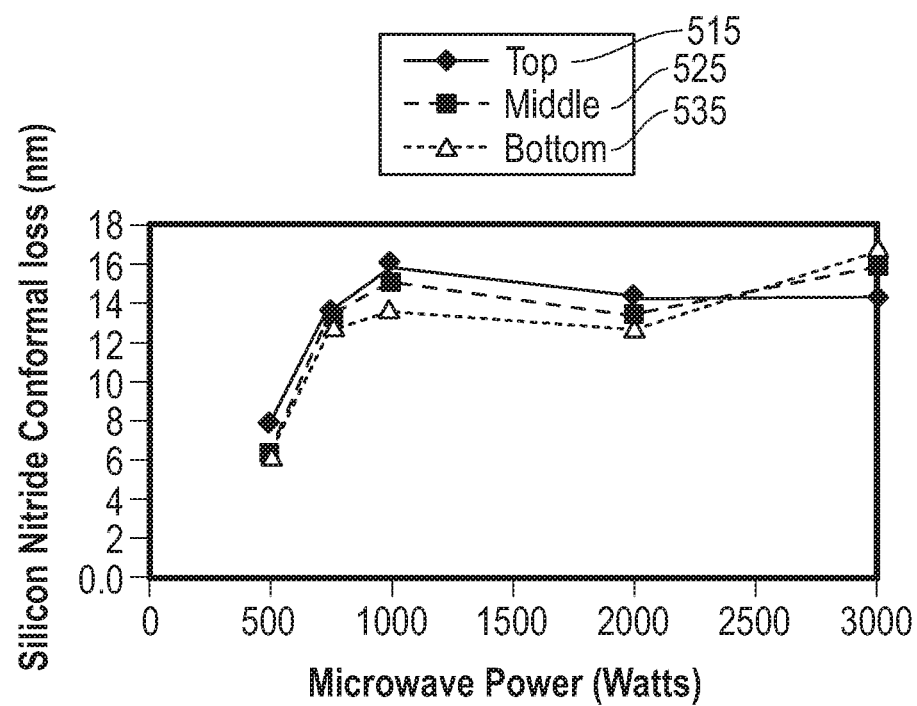
FIG. 5B provides exemplary silicon nitride loss at the top, middle and bottom of a structure versus microwave power data for an etch according to the techniques disclosed herein.

The conformal etch nature of such an etch is further shown with the test data illustrated in FIGS. 5A and 5B. More specifically, FIG. 5A illustrates the etch rate on a blanket $Si_3N_4$ test substrate using a plasma at 300 milliTorr (mT) with gas flows of $SF_6$ 100 sccm, $O_2$ 800 sccm and $N_2$ 50 sccm. As shown in the figure, an etch rate plot 500 illustrates the $Si_3N_4$ etch rate (A/min) versus the microwave power (Watts). FIG. 5B illustrates the $Si_3N_4$ loss using an etch as described for FIG. 5A on a structure similar to that of FIG. 4 having a pitch of 112 nm. More particularly, a structure such as the $Si_3N_4$ layer 410A in FIG. 4 may be analyzed for the amount of nitride loss during the etch at the top regions 412, middle regions 414 and bottom regions 416 of the 112 nm pitch structures. As shown in FIG. 5B, the $Si_3N_4$ loss (nm) versus microwave power (Watts) is shown for the top regions 412 by plot 515, middle regions 414 by plot 525, and bottom regions 416 by plot 635. FIGS. 5A and 5B, thus, illustrate the etch effects at a variety of microwave power settings.

In the exemplary plasma conditions shown, it will be noted that gas ratios are provided in which $O_2 > N_2 > SF_6$. Such a chemistry may provide the desired conformal etching with the desired selectivity. Further, the plasma may be provided at a relative high pressure, for example higher than 250 milliTorr (mT), and more preferably 300 mT or higher. In one embodiment, a radial line slot antenna (RLSA) microwave plasma system may be utilized with zero bias power. As known in the art, such a system may ignite the plasma through the use of a top electrode that uses a microwave design that delivers power to the plasma chamber. Thus, in one exemplary embodiment, a microwave power source is provided that operates in an RLSA chamber in the absence of bias power.

It will be recognized that the etch characteristics described herein may be useful for a wide variety of substrate processing integration applications. Described below are exemplary substrate processing integration applications

TABLE 1

| Pressure (mT) | Microwave Power (W) | Bias Power (W) | $SF_6$ (sccm) | $N_2$ (sccm) | $O_2$ (sccm) | Ar (sccm) | RDC | Chiller/ESC Temp Center/Edge | Etch Time (sec) |
|---|---|---|---|---|---|---|---|---|---|
| 300 | variable | 0 | 40 | 100 | 800 | 1000 | 50 | 30/70/70 | 180 |

Figure 2:
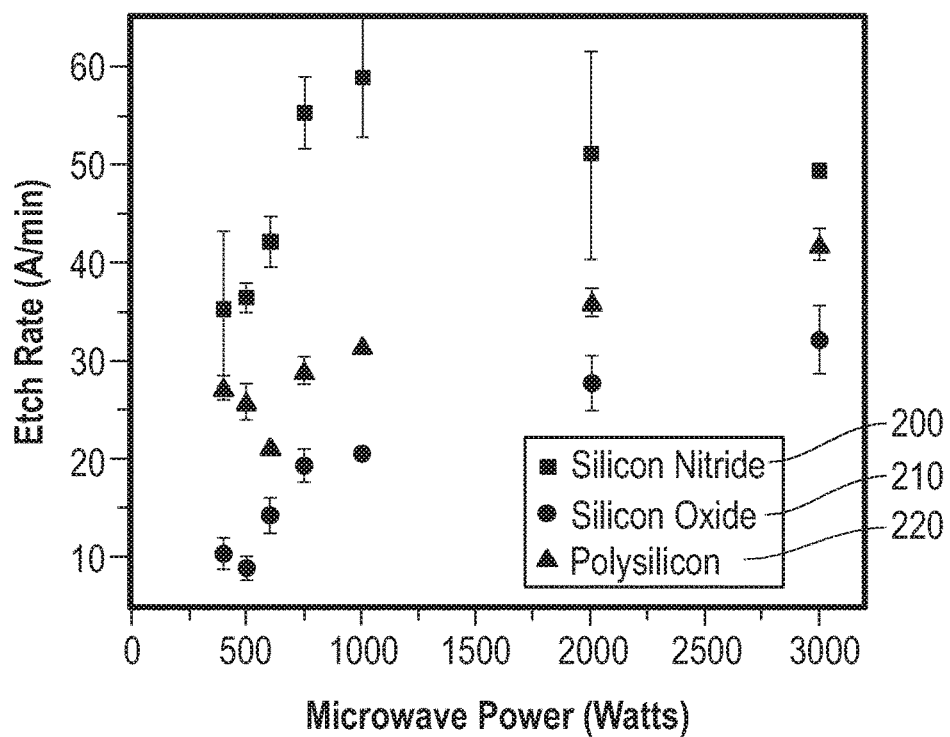
FIG. 2 provides exemplary etch rate versus microwave power data for an etch according to the techniques disclosed herein.
Figure 3:
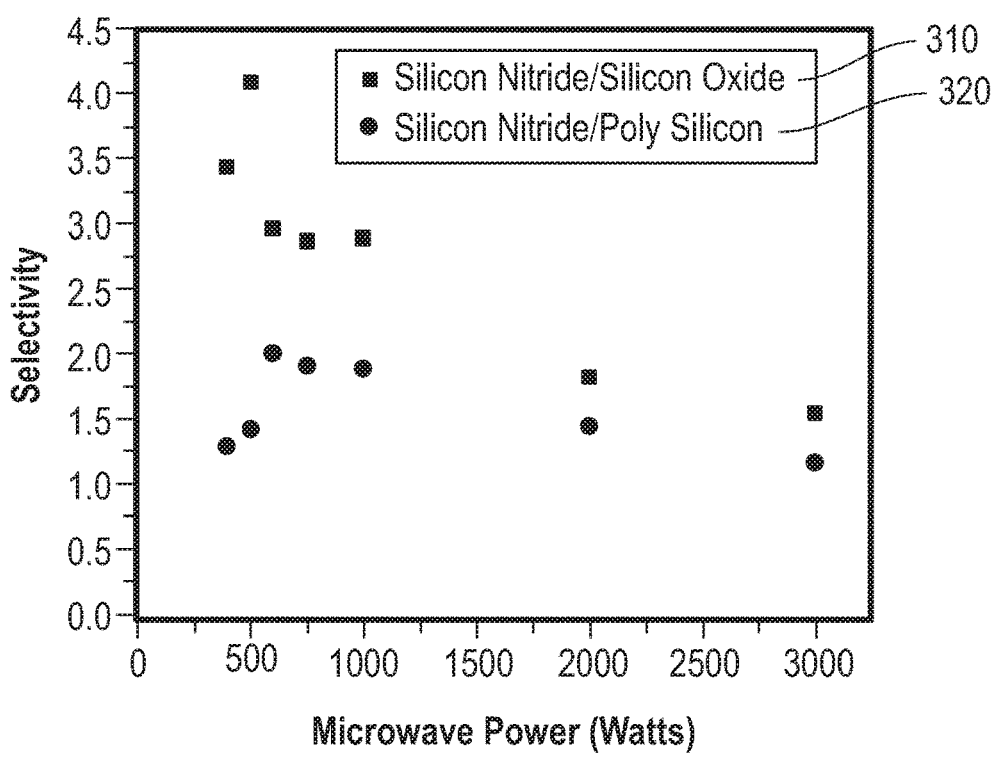
FIG. 3 provides exemplary selectivity versus microwave power data for an etch according to the techniques disclosed herein.

Utilizing such conditions, etch rates and selectivities for silicon nitride, silicon oxide and polysilicon may be obtained as shown in FIGS. 2 and 3 for various microwave power settings. As shown in FIG. 2, etch rate (A/min) versus microwave power (Watts) is graphed for $Si_3N_4$ 200, $SiO_2$ 210 and polysilicon 220. Similarly, as shown in FIG. 3, selectivity versus microwave power (Watts) is graphed for $Si_3N_4$ to $SiO_2$ selectivity 310 and $Si_3N_4$ to polysilicon selectivity 320.

which may utilize the conformal, selective etch technique described herein. The disclosed etch technique is not, however, limited to these particular applications.

Figure 6A:
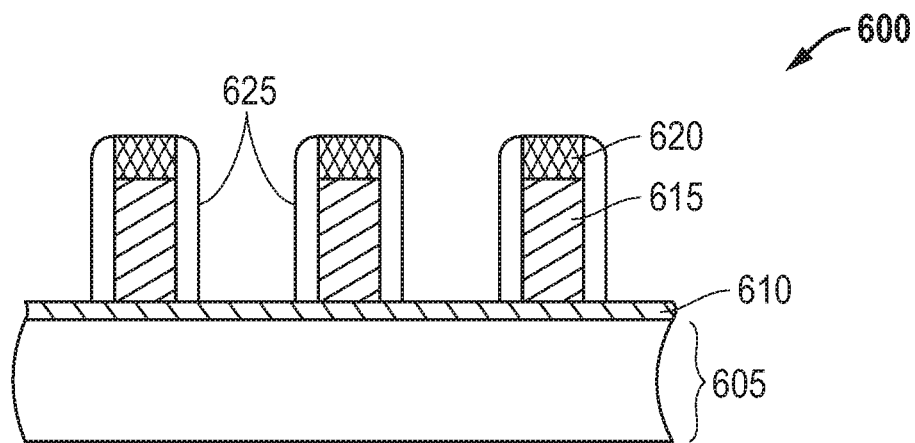
FIGS. 6A and 6B show exemplary structures before etch and after use of an etch according to the techniques disclosed herein.
Figure 6B:
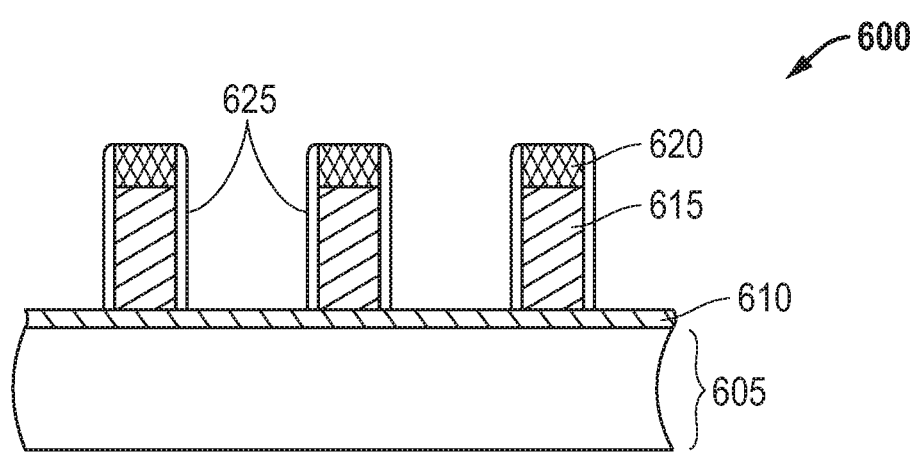

In one embodiment, the etch technique may be utilized in a process that trims a silicon nitride spacer. For example, as shown in FIG. 6A, a substrate 600 is provided that has one or more underlying layers 605, an oxide layer 610, and a hard mask structure formed of an amorphous silicon structure 615 and silicon nitride structure 620. Over the hard mask structure, an in-situ radical assisted deposition (iRad) silicon nitride layer may be formed and the processed to provide silicon nitride spacers 625 on the sidewalls of the hard mask structure as is known in the art. Next, in order to trim to the silicon nitride spacers 625 to a final desired thickness, the $SF_6/N_2/O_2$ plasma etch techniques described herein may be utilized. In this manner, the silicon nitride spacers 625 may be trimmed with a conformal (isotropic) etch while providing selectivity to the underlying oxide layer 610. Thus, after etch the structure of FIG. 6B may result. As shown in FIG. 6B, the silicon nitride spacers 625 have been trimmed to a desired thickness with a conformal etch that is selective to the underlying oxide layer 610. In one exemplary embodiment, the silicon nitride spacers 625 may have a width of 20 nm before etch and trimmed to 5 nm while only removing 5 nm or less of the oxide layer 610. It will be recognized by those skilled in the art that the dimensions provided herein are merely exemplary and the conformal silicon nitride etch techniques described herein may be utilized on a wide variety of other structures.

Figure 7A:
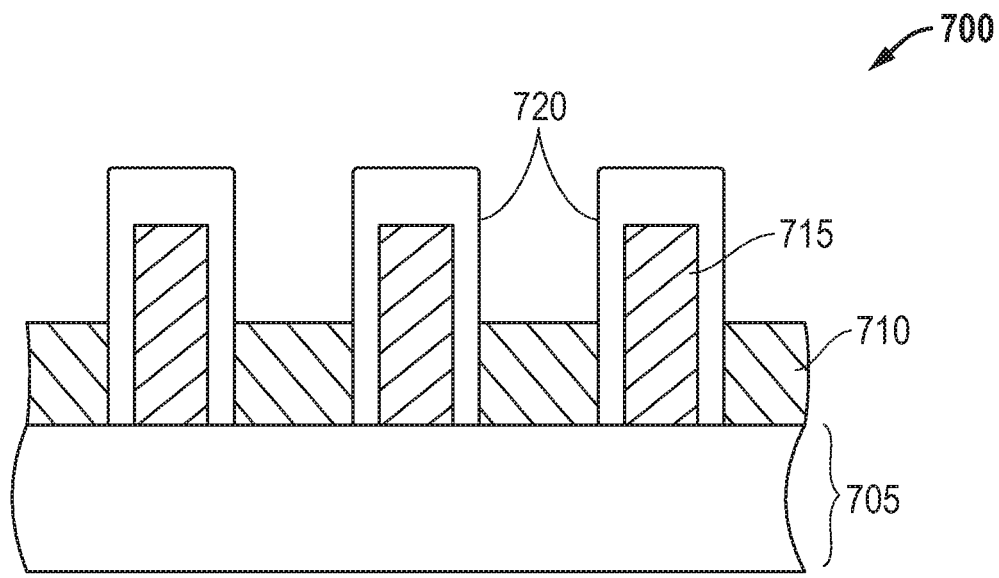
FIGS. 7A and 7B show exemplary structures before etch and after use of an etch according to the techniques disclosed herein.
Figure 7B:
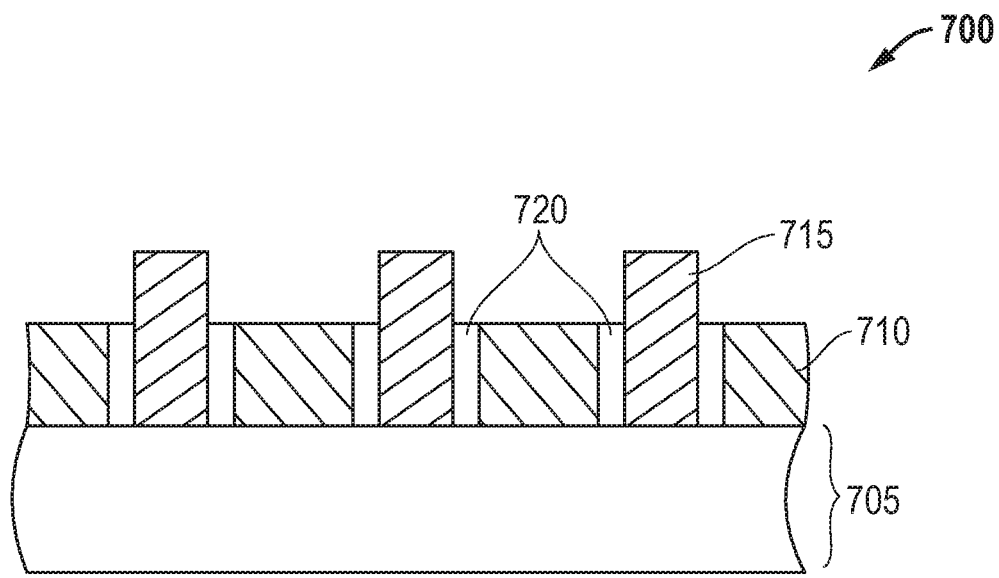

In another application, the disclosed $SF_6/N_2/O_2$ plasma etch process may be used in a Fin process application, such as for example but not limited to, a fin field effect transistor (FinFET) process. As shown in FIG. 7A, a substrate 700 may be provided in which Fins 715 (such as for example Fin active regions of a FinFET) are formed on underlying layers 705. A silicon nitride hard mask 720 may overly the Fins 715. An oxide layer 710 may be provided as shown. The etch process disclosed herein may be utilized to reveal the Fins 715 without etching the exposed oxide layer 710. More specifically, the silicon nitride hard mask 720 which overlays the Fins may be removed selectively to exposed oxide layer 710 such as shown in FIG. 7B.

Figure 8A:
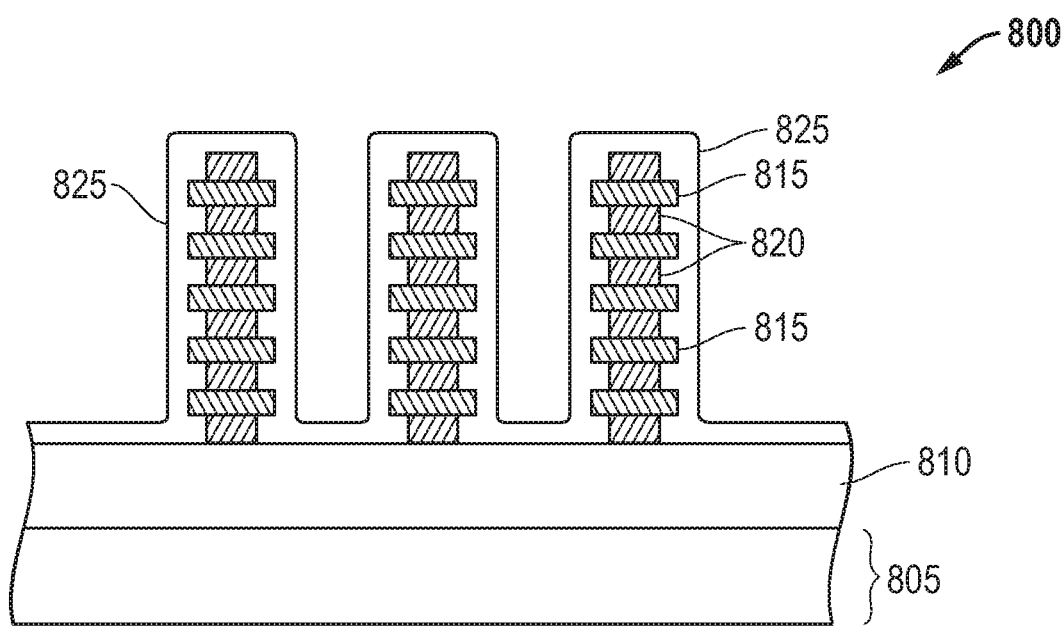
FIGS. 8A and 8B show exemplary structures before etch and after use of an etch according to the techniques disclosed herein.
Figure 8B:
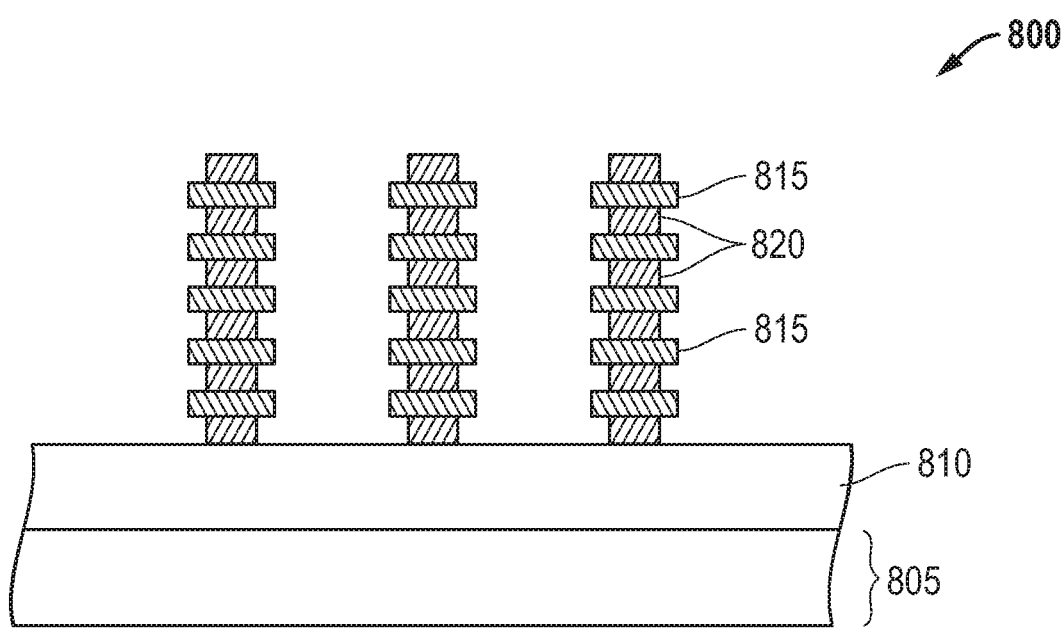

In yet another application, the etch technique disclosed herein may be utilized in a silicon nanosheet application. More specifically the etch technique may be used as part of a nanosheet reveal step. For example, as shown in FIG. 8A, a substrate 800 may have underlying layers 805, oxide 810, a plurality of silicon nanosheets 815 and a plurality of intervening germanium layers 820. As shown, the plurality of silicon nanosheets 815 and intervening germanium layers 820 may be overlaid with a silicon nitride hard mask layer 825. The silicon nitride hard mask layer 825 may be formed, for example, by atomic layer deposition. The $SF_6/N_2/O_2$ plasma etch process disclosed herein may be used to conformally etch the silicon nitride hard mask layer 825 to reveal the silicon nanosheets 815 as shown in FIG. 8B. Moreover, the etch of the silicon nitride hard mask layer 825 may be selective to the silicon nanosheets 815. In this manner, a conformal, selective silicon nitride etch is provided as part of the nanosheet process integration flow.

As mentioned, it will be recognized that the applications described above are merely exemplary, and many other process flows and applications may advantageously utilize the etch techniques disclosed herein.

Figure 9:
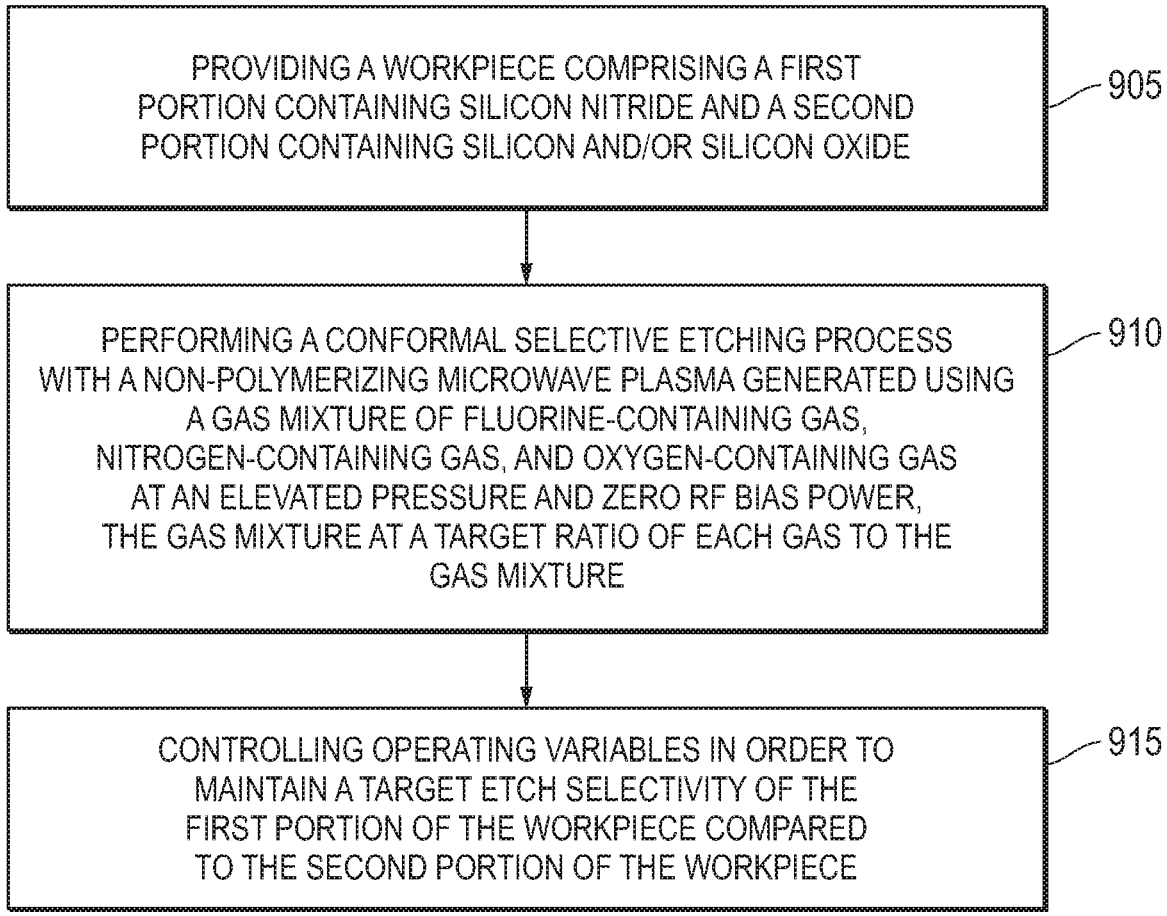
FIGS. 9 and 10 illustrate exemplary methods for using the etch techniques disclosed herein.

FIGS. 8 and 9 illustrate methods for use of the plasma etch techniques described herein. It will be recognized that the embodiments of FIGS. 8 and 9 are merely exemplary and additional methods may utilized the techniques described herein. Further, additional processing steps may be added to the methods shown in the FIGS. 8 and 9 as the steps described are not intended to be exclusive. Moreover, the order of the steps is not limited to the order shown in the figures as different orders may occur and/or various steps may be performed in combination or at the same time.

As shown in FIG. 9, a method of conformal selective silicon nitride etching is provided. As shown in FIG. 9, the method includes a step 905 of providing a workpiece comprising a first portion containing silicon nitride and a second portion containing silicon and/or silicon oxide. The method further includes a step 910 of performing a conformal selective etching process with a non-polymerizing microwave plasma generated using a gas mixture of fluorine-containing gas, nitrogen-containing gas, and oxygen-containing gas at an elevated pressure and zero bias power, the gas mixture at a target ratio of each gas to the gas mixture. The method further includes a step 915 of controlling operating variables in order to maintain a target etch selectivity of the first portion of the workpiece compared to the second portion of the workpiece.

Figure 10:
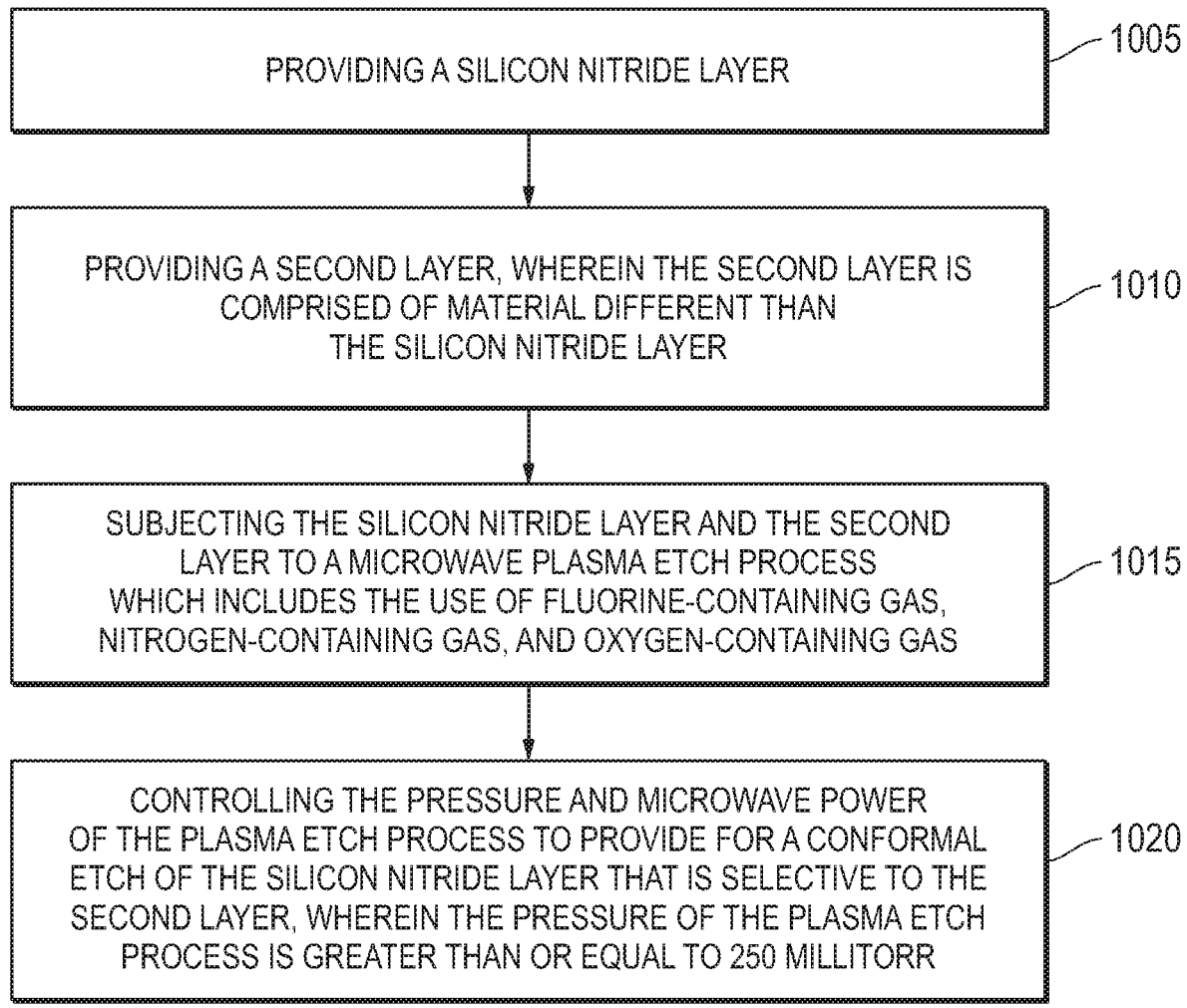

As shown in FIG. 10, a method of processing a substrate is provided. The method may include step 1005 of providing a silicon nitride layer and step 1010 of providing a second layer, wherein the second layer is comprised of material different than the silicon nitride layer. The method may further include a step 1015 for subjecting the silicon nitride layer and the second layer to a microwave plasma etch process which includes the use of fluorine-containing gas, nitrogen-containing gas, and oxygen-containing gas. The method may further include a step 1020 of controlling the pressure and microwave power of the plasma etch process to provide for a conformal etch of the silicon nitride layer that is selective to the second layer, wherein the pressure of the plasma etch process is greater than or equal to 250 milliTorr.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method of conformal selective silicon nitride etching, the method comprising:
    providing a workpiece comprising a first portion containing silicon nitride and a second portion containing silicon and/or silicon oxide;
    performing a conformal selective etching process with a non-polymerizing microwave plasma generated using a gas mixture of fluorine-containing gas, nitrogen-containing gas, and oxygen-containing gas at an elevated pressure and zero bias power, the gas mixture at a target ratio of each gas to the gas mixture, wherein the gas mixture comprises $SF_6$, $N_2$ and $O_2$, and the gases are provided in relative gas ratios of $O_2 > N_2 > SF_6$, by volume; and
    controlling operating variables in order to maintain a target etch selectivity of the first portion of the workpiece compared to the second portion of the workpiece.

2. The method of claim 1, wherein the conformal selective etching process is used to trim a silicon nitride spacer.

3. The method of claim 1, wherein the conformal selective etching process is used to reveal a nanosheet.

4. The method of claim 1, wherein the conformal selective etching process is used to reveal a Fin.

5. The method of claim 4, wherein the Fin is part of a FinFET.

6. A method of processing a substrate, the method comprising:
- providing a silicon nitride layer;
- providing a second layer, wherein the second layer is comprised of material different than the silicon nitride layer;
- subjecting the silicon nitride layer and the second layer to a microwave plasma etch process which includes the use of fluorine-containing gas, nitrogen-containing gas, and oxygen-containing gas; and
- controlling a pressure and a microwave power of the plasma etch process to provide for a conformal etch of the silicon nitride layer that is selective to the second layer, wherein the pressure of the plasma etch process is greater than or equal to 250 milliTorr.

7. The method of claim 6, wherein a gas mixture of the plasma etch process comprises $SF_6$, $N_2$ and $O_2$ gases and wherein $SF_6$, $N_2$ and $O_2$ gases are provided in relative gas ratios of $O_2 > N_2 > SF_6$, by volume.

8. The method of claim 6, wherein the second layer is comprised of silicon or silicon oxide.

9. The method of claim 8, wherein the conformal etch of the silicon nitride layer is used to trim a silicon nitride spacer.

10. The method of claim 9, wherein a gas mixture of the plasma etch process comprises $SF_6$, $N_2$ and $O_2$ gases and wherein $SF_6$, $N_2$ and $O_2$ gases are provided in relative gas ratios of $O_2 > N_2 > SF_6$, by volume.

11. The method of claim 8, wherein the conformal etch of the silicon nitride layer is used to reveal a fin or to reveal a nanosheet.

12. The method of claim 11, wherein a gas mixture of the plasma etch process comprises $SF_6$, $N_2$ and $O_2$ gases and wherein $SF_6$, $N_2$ and $O_2$ gases are provided in relative gas ratios of $O_2 > N_2 > SF_6$, by volume.

* * * * *